(12) United States Patent
Jung

(10) Patent No.: US 7,892,981 B2
(45) Date of Patent: Feb. 22, 2011

(54) METHOD OF FORMING A MICRO PATTERN OF A SEMICONDUCTOR DEVICE

(75) Inventor: Woo-Yung Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 691 days.

(21) Appl. No.: 11/949,642

(22) Filed: Dec. 3, 2007

(65) Prior Publication Data

US 2008/0248654 A1 Oct. 9, 2008

(30) Foreign Application Priority Data

Apr. 6, 2007  (KR) .................. 10-2007-0034202

(51) Int. Cl.
*H01L 21/302* (2006.01)

(52) U.S. Cl. ............... 438/717; 438/689; 438/690; 438/692; 438/700; 216/37; 216/67

(58) Field of Classification Search ............ 438/689, 438/690, 692, 700
See application file for complete search history.

(56) References Cited

U.S. PATENT DOCUMENTS 7,488,685 B2 * 2/2009 Kewley ............... 438/689
2006/0273456 A1 12/2006 Sant et al.
2007/0049011 A1 3/2007 Tran

FOREIGN PATENT DOCUMENTS

| CN | 1469457 | | 1/2004 |
| KR | 1020050067488 | A | 7/2005 |
| KR | 100640657 | B1 | 10/2006 |
| KR | 100642886 | B1 | 10/2006 |
| KR | 1020070051196 | A | 5/2007 |
| KR | 100822592 | B1 | 4/2008 |
| KR | 1020080039006 | A | 5/2008 |

OTHER PUBLICATIONS

Jung et al., "Patterning with amorphous carbon spacer for expanding the resolution limit of current lithography tool," *Proc. of SPIE* vol. 6520, 65201C-1 (2007).

* cited by examiner

*Primary Examiner*—Nadine G Norton
*Assistant Examiner*—Maki A Angadi
(74) *Attorney, Agent, or Firm*—Kilpatrick Townsend & Stockton LLP

(57) ABSTRACT

A method of forming a micro pattern of a semiconductor device includes forming an etch target layer, a hard mask layer, a Bottom Anti-Reflective Coating (BARC) layer and a first photoresist pattern over a semiconductor substrate. An organic layer is formed on a surface of the first photoresist pattern. A second photoresist layer is formed over the BARC layer and the organic layer. An etch process is performed so that the second photoresist layer remains on the BARC layer between the first photoresist patterns and becomes a second photoresist pattern. The organic layer on the first photoresist pattern and between the first and second photoresist patterns is removed. The BARC layer formed below the organic layer is removed. The hard mask layer is etched using the first and second photoresist patterns as an etch mask. The etch target layer is etched using a hard mask pattern as an etch mask.

77 Claims, 7 Drawing Sheets

METHOD OF FORMING A MICRO PATTERN OF A SEMICONDUCTOR DEVICE

CROSS-REFERENCES TO RELATED APPLICATIONS

The present application claims priority to Korean patent application number 2007-34202, filed on Apr. 6, 2007, which is incorporated by reference in its entirety.

BACKGROUND OF THE INVENTION

The present invention relates to semiconductor devices, and more particularly, to a method of forming a micro pattern of a semiconductor device, in which the number of process steps can be reduced during a micro pattern formation process.

As the degree of integration of devices increases, the size of the minimum line width to be implemented is reduced. In order to implement a reduced micro line width due to the high integration of the devices, various process steps are required. To form a hard mask pattern for forming a micro pattern, a mask formation process, a Double Exposure Etch Tech (DEET) method or a spacer formation process having several steps must be carried out. The process method increases not only the overall number of process steps, but also device mass-production costs.

SUMMARY OF THE INVENTION

Accordingly, the present invention addresses the above problems, and discloses a method of forming a micro pattern of a semiconductor device in which the micro pattern is formed through a reduced number of process steps, thereby reducing device mass-production costs.

In a method of forming a micro pattern of a semiconductor device according to an aspect of the present invention, an etch target layer, a hard mask layer, a Bottom Anti-Reflective Coating (BARC) layer and a first photoresist pattern containing silicon (Si) are formed over a semiconductor substrate. An organic layer is formed over a surface of the first photoresist pattern. A second photoresist layer containing silicon (Si) is formed over the BARC layer and the organic layer. A first etch process is performed so that the second photoresist layer remains on the BARC layer between the first photoresist patterns and becomes a second photoresist pattern. The organic layer on the first photoresist pattern and between the first and second photoresist patterns, and the BARC layer formed below the organic layer are removed. The hard mask layer is etched by a second etch process using the first and second photoresist patterns as an etch mask, thereby forming a hard mask pattern. The etch target layer is then etched by a third etch process using the hard mask pattern as an etch mask.

In another method of forming a micro pattern of a semiconductor device according to an aspect of the present invention, an etch target layer, a hard mask layer, a BARC layer and a first photoresist pattern containing silicon (Si) are formed over a semiconductor substrate. The semiconductor substrate includes a cell gate region, a selective transistor region and a peri region. An organic layer is formed over a surface of the first photoresist pattern. A second photoresist layer containing silicon (Si) is formed over the BARC layer and the organic layer. The second photoresist layer formed in the selective transistor region and the peri region is removed. A first etch process is performed such that the second photoresist layer formed in the cell gate region remains on the BARC layer between the first photoresist patterns and becomes a second photoresist pattern. The organic layer on the first photoresist pattern and between the first and second photoresist patterns, and the BARC layer formed below the organic layer in the cell gate region are removed. The hard mask layer is etched by a second etch process using the first and second photoresist patterns as an etch mask, thereby forming a hard mask pattern. The etch target layer is etched by a third etch process using the hard mask pattern as an etch mask.

In still another method of forming a micro pattern of a semiconductor device according to an aspect of the present invention, an etch target layer, a hard mask layer, a BARC layer containing silicon and a first auxiliary pattern are formed over a semiconductor substrate. An organic layer containing silicon is formed over a surface of the first auxiliary pattern. A second auxiliary layer is formed over the BARC layer and the organic layer. A first etch process is performed such that the second auxiliary layer remains on the BARC layer between the first auxiliary patterns and becomes a second auxiliary pattern. The organic layer on the first auxiliary pattern and between the first and second auxiliary patterns, and the BARC layer formed below the organic layer are removed. The hard mask layer is etched by a second etch process using the first and second auxiliary patterns as etch masks, thereby forming a hard mask pattern. The etch target layer is etched by a third etch process using the hard mask pattern as an etch mask.

In still another method of forming a micro pattern of a semiconductor device according to an aspect of the present invention, an etch target layer, a hard mask layer, a BARC layer containing silicon and a first auxiliary pattern are formed over a semiconductor substrate. The semiconductor substrate includes a cell gate region, a selective transistor region and a peri region. An organic layer containing silicon is formed over a surface of the first auxiliary pattern. A second auxiliary layer is formed over the BARC layer and the organic layer. The second auxiliary layer formed in the selective transistor region and the peri region is removed. A first etch process is performed so that the second auxiliary layer formed in the cell gate region remains on the BARC layer between the first auxiliary patterns and becomes a second auxiliary pattern. The organic layer on the first auxiliary pattern and between the first and second auxiliary patterns, and the BARC layer formed below the organic layer in the cell gate region are removed. The hard mask layer is etched by a second etch process using the first and second auxiliary patterns as etch masks, thereby forming a hard mask pattern. The etch target layer is etched by a third etch process using the hard mask pattern as an etch mask.

DESCRIPTION OF SPECIFIC EMBODIMENTS

Specific embodiments according to the present invention will be described with reference to the accompanying drawings.

FIGS. 1A to 1G are cross-sectional views illustrating a method of forming a micro pattern of a semiconductor device according to a first embodiment of the present invention. In this method, process steps are performed only on a cell gate region.

Figure 1A:
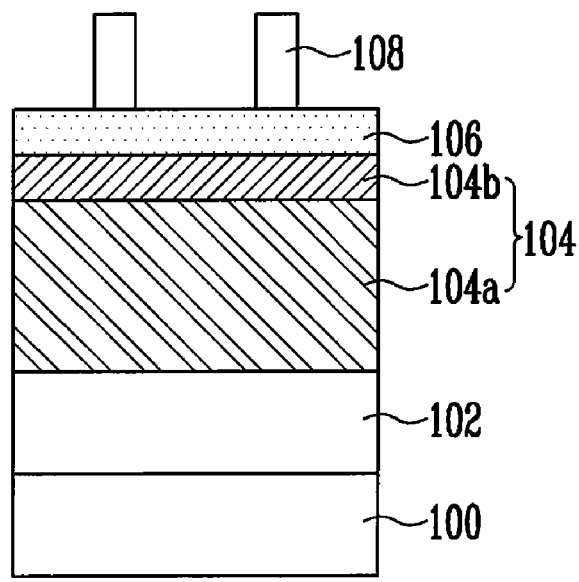
FIGS. 1A to 1G are cross-sectional views illustrating a method of forming a micro pattern of a semiconductor device according to a first embodiment of the present invention.

Referring to FIG. 1A, an etch target layer 102 is formed over a semiconductor substrate 100. The etch target layer 102 can be formed as a film, such as an insulating layer, a conductive layer or an interlayer insulating layer. A hard mask layer 104 and a BARC layer 106 are formed over the etch target layer 102. The hard mask layer 104 has a stack structure including an amorphous carbon layer 104a and a silicon oxynitride (SiON) layer 104b. The BARC layer 106 may include silicon (Si).

Thereafter, a first auxiliary pattern 108 is formed on the BARC layer 106. The first auxiliary pattern 108 may be a photoresist layer or a photoresist layer containing silicon (Si). The Critical Dimension (CD) of the first auxiliary pattern 108 is defined to be approximately half of the pitch of a micro pattern (not yet formed).

Figure 1B:
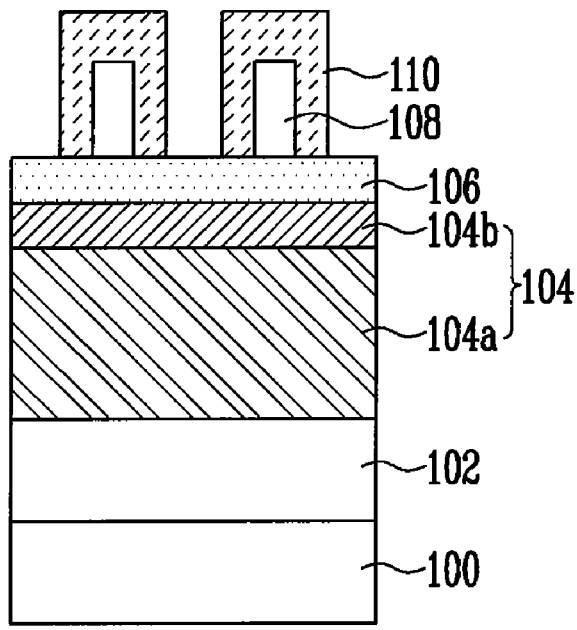

Referring to FIG. 1B, an insulating layer 110 is formed on the surface of the first auxiliary pattern 108. The insulating layer 110 may be an organic layer containing silicon (Si), or an organic layer not containing silicon (Si). The organic layer not containing silicon (Si) is preferably an amorphous carbon layer. The insulating layer 110 may be formed only on the surface of the first auxiliary pattern 108, but may also be formed on the surface of the BARC layer 106 and the first auxiliary pattern 108. The insulating layer 110 may be formed using material having a different etch selectivity with respect to material of a second auxiliary layer 112 (formed in a subsequent process) and the first auxiliary pattern 108 to sufficiently remove the first auxiliary pattern 108 and the second auxiliary pattern 112a without damage during a subsequent removal of the insulating layer 110. The thickness of the insulating layer 110 deposited on the surface of the first auxiliary pattern 108 is set to approximately half of the pitch of a micro pattern (not yet formed).

Figure 1C:
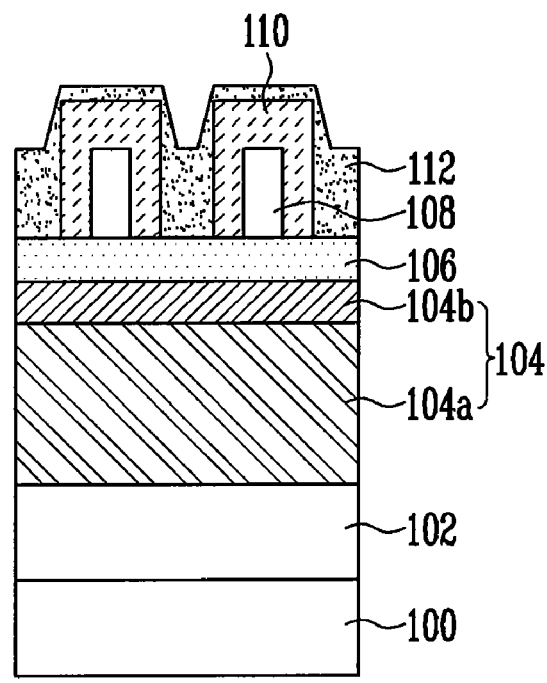

Referring to FIG. 1C, the second auxiliary layer 112 is formed over the BARC layer 106 and the insulating layer 110 so that a space between the first auxiliary patterns 108 is filled. The second auxiliary layer 112 may be formed of a photoresist layer or a photoresist layer containing silicon (Si). Thus, the second auxiliary layer 112 has a different etch selectivity with respect to the insulating layer 110.

Figure 1D:
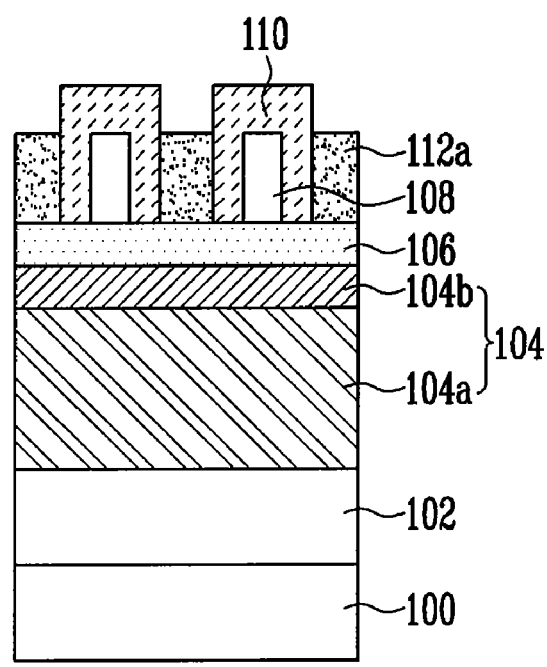

Referring to FIG. 1D, the second auxiliary layer 112 is etched until a top surface of the insulating layer 110 is exposed, thereby forming a second auxiliary pattern 112a. The etch process may include performing an etchback process. During the removal process of the second auxiliary layer 112, the second auxiliary layer 112 formed between the insulating layers 110 remains up to the height of the first auxiliary pattern 108. The second auxiliary layer 112 has a different etch selectivity with respect to the insulating layer 110. Accordingly, the first auxiliary pattern 108 and the second auxiliary pattern 112a are formed of material having substantially the same etch selectivity.

Figure 1E:
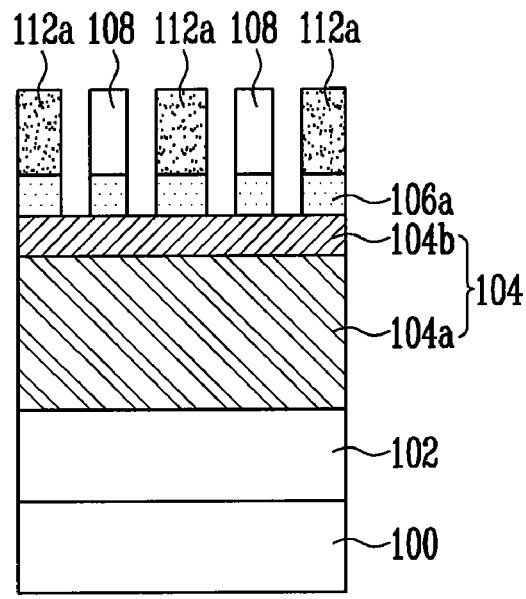

Referring to FIG. 1E, the insulating layer 110 formed between the insulating layer 110 exposed by the etch process of the second auxiliary layer 112, and the first auxiliary pattern 108 and the second auxiliary pattern 112a, and the BARC layer 106 formed below the insulating layer 110 are removed. Thus, the BARC layer 106 remains only below the first auxiliary pattern 108 and the second auxiliary pattern 112a. A BARC pattern 106a is thereby formed. The insulating layer 110 is removed by a dry etch process. As described above with reference to FIG. 1B, if the insulating layer 110 is also formed on the BARC layer 106 during the formation process of the insulating layer 110, the insulating layer 110 also remains below the second auxiliary pattern 112a during the removal process of the insulating layer 110.

Accordingly, the insulating layer 110 has a different etch selectivity with respect to the first auxiliary pattern 108 and the second auxiliary pattern 112a, and has substantially the same etch selectivity as that of the BARC layer 106. Since the second auxiliary pattern 112a is formed between the first auxiliary patterns 108 as described above, a desired pitch can be obtained.

Figure 1F:
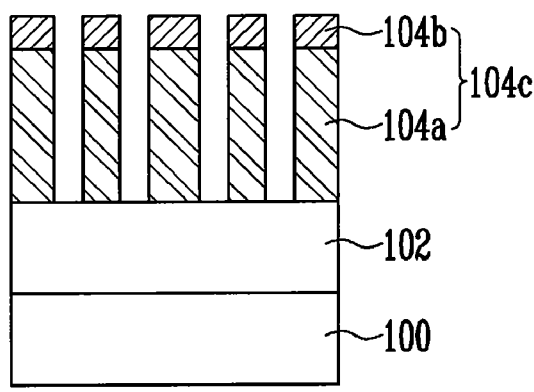

Referring to FIG. 1F, a hard mask pattern 104c having a desired line and space is formed by etching the hard mask layer 104 using the first auxiliary pattern 108, the BARC pattern 106a and the second auxiliary pattern 112a as etch masks. The hard mask layer 104 is removed by a dry etch process. By forming the first auxiliary pattern 108 and the second auxiliary pattern 112a with material having substantially the same etch selectivity, the etch process is facilitated during the etch process of the hard mask layer 104. Thus, and the hard mask pattern 104c is uniform. In other words, the etch process of the hard mask layer 104 using the first auxiliary pattern 108 and the second auxiliary pattern 112a formed of material having substantially the same etch selectivity is more convenient than that of the hard mask layer 104 using the first auxiliary pattern 108 and the second auxiliary pattern 112a formed of material having different selectivities.

Thereafter, the first auxiliary pattern 108, the BARC pattern 106a and the second auxiliary pattern 112a are removed to form a micro pattern consisting of the hard mask pattern 104c.

Figure 1G:
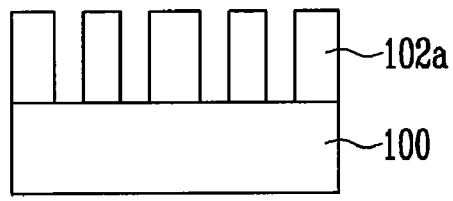

Referring to FIG. 1G, the etch target layer 102 is etched using the hard mask pattern 104c having a desired line and space as an etch mask, thereby forming a target etch pattern 102a. The hard mask pattern 104c is then removed.

As described above, by forming the micro pattern only by the formation process of the first auxiliary pattern 108 and the second auxiliary pattern 112a, a micro pattern having a desired CD can be formed. Furthermore, the number process steps can be reduced since a DEET method or a spacer formation process are not conducted. It is therefore possible to reduce device mass-production costs.

Furthermore, by forming the first auxiliary pattern 108 and the second auxiliary pattern 112a having substantially the same etch selectivity, a uniform etch pattern can be formed during the etch process employing the first auxiliary pattern 108 and the second auxiliary pattern 112a. Accordingly, etching is more convenient compared to when performing the etch process using the first auxiliary pattern 108 and the second auxiliary pattern 112a formed of different materials.

An example in which the present invention is applied to a method of manufacturing a NAND flash memory device is described below.

FIGS. 2A to 2H are cross-sectional views illustrating a method of forming a micro pattern of a semiconductor device according to a second embodiment of the present invention.

Figure 2A:
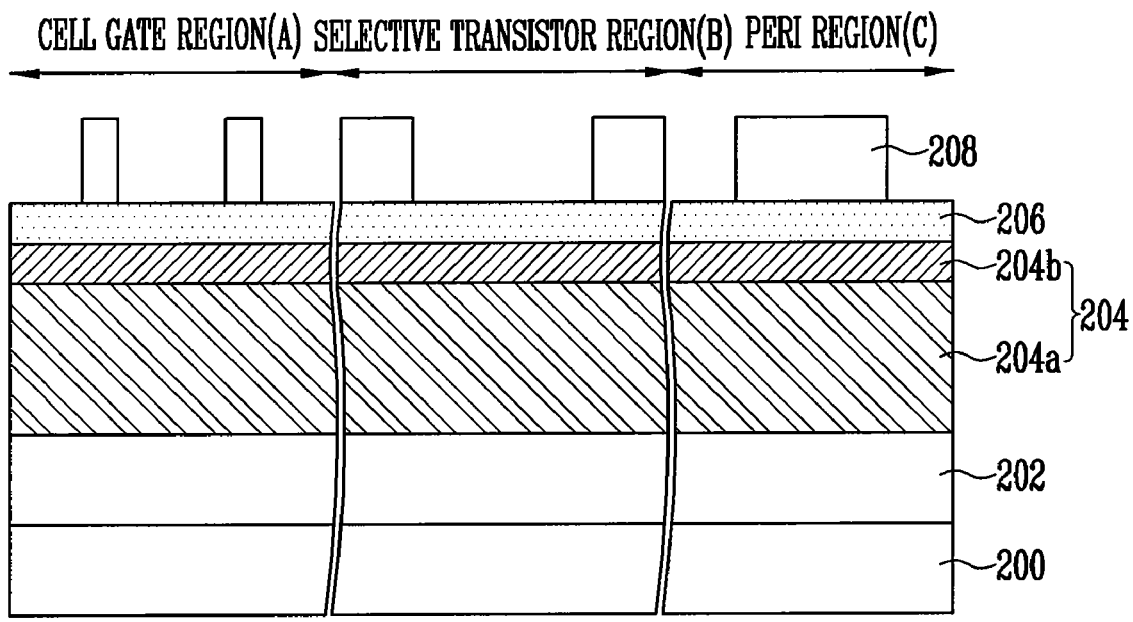
FIGS. 2A to 2H are cross-sectional views illustrating a method of forming a micro pattern of a semiconductor device according to a second embodiment of the present invention.

Referring to FIG. 2A, an etch target layer 202 is formed on a semiconductor substrate 200 having a cell gate region A, a selective transistor region B and a peri region C. The etch target layer 202 is formed of a tungsten silicide (WSix) layer. A stack structure including a tunnel insulating layer, a first conductive layer for a floating gate, a dielectric layer and a second conductive layer for a control gate are formed between the tungsten silicide (WSix) layer and the semiconductor substrate 200.

Thereafter, a hard mask layer 204 and a BARC layer 206 are formed over the etch target layer 202. The hard mask layer 204 may have a stack structure including an amorphous carbon layer 204a and a silicon oxynitride (SiON) layer 204b, and the BARC layer 206 may be formed using BARC containing silicon (Si).

Thereafter, a first auxiliary pattern 208 is formed on the BARC layer 206. The first auxiliary pattern 208 may be formed of a photoresist layer or a photoresist layer containing silicon (Si). The CD of the first auxiliary pattern 208 is set to be approximately half of the pitch of a micro pattern (not yet formed).

Figure 2B:
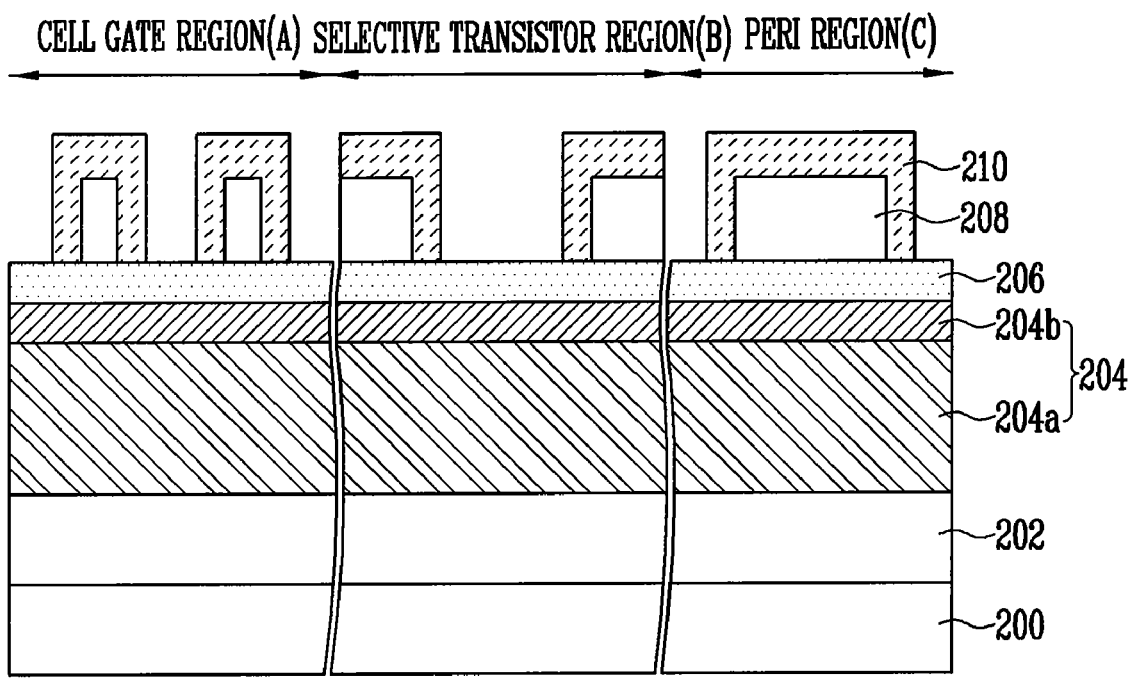

Referring to FIG. 2B, an insulating layer 210 is formed over the BARC layer 206 and the first auxiliary pattern 208. The insulating layer 210 may be formed of an organic layer containing silicon (Si) or an organic layer not containing silicon (Si). The organic layer not containing silicon (Si) may be an amorphous carbon layer. The insulating layer 210 may be formed only on the surface of the first auxiliary pattern 208, but may also be formed on the surface of the BARC layer 206 and the first auxiliary pattern 208. The insulating layer 210 is formed using material having a different etch selectivity with respect to the material of the second auxiliary layer 212 and the first auxiliary pattern 208 (formed in a subsequent process). Accordingly, during a removal process of the insulating layer 210, the first auxiliary pattern 208 and the second auxiliary pattern 212a may be removed without being damaged. The thickness of the insulating layer 210, which is deposited on a side of the first auxiliary pattern 208, is set to be approximately half of the pitch of a micro pattern (not yet formed).

Figure 2C:
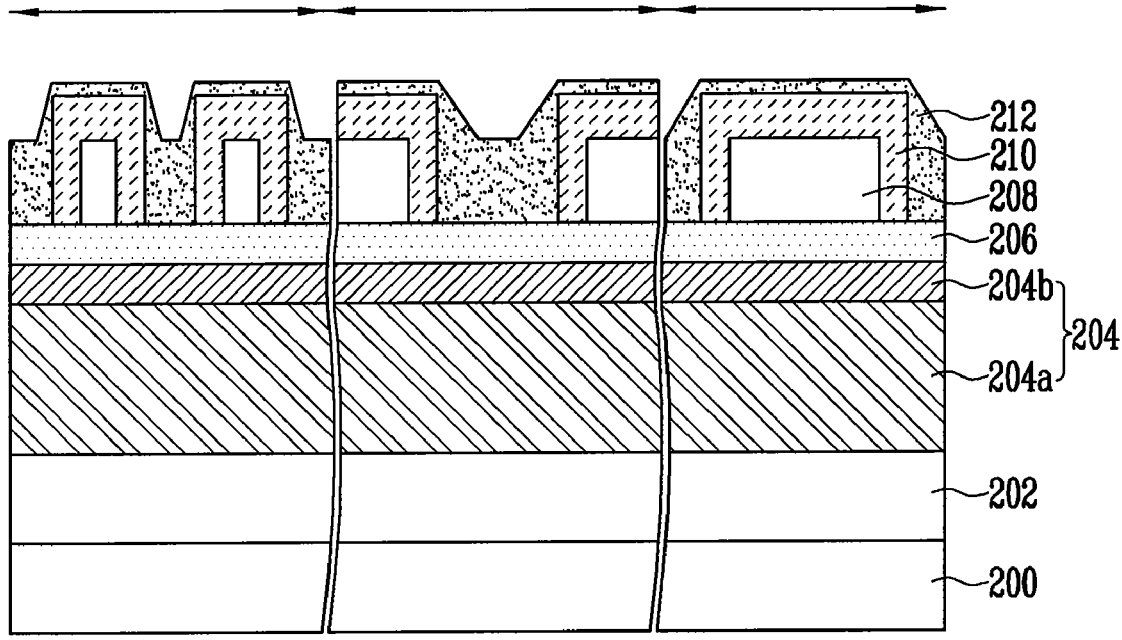

Referring to FIG. 2C, a second auxiliary layer 212 is formed over the BARC layer 206 and the insulating layer 210 so that a space between the first auxiliary pattern 208 is filled. The second auxiliary layer 212 may be a photoresist layer or a photoresist layer containing silicon (Si). Thus, the second auxiliary layer 212 has a different etch selectivity with respect to the insulating layer 210.

Figure 2D:
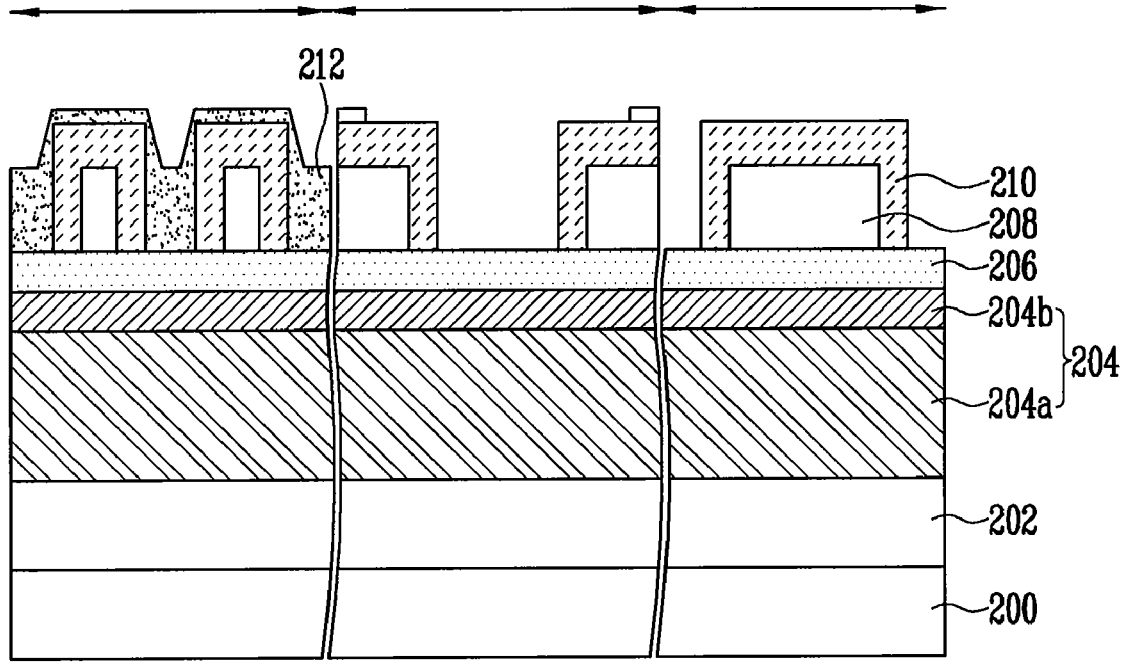

Referring to FIG. 2D, a photoresist pattern (not illustrated) is formed on the second auxiliary layer 212 of the cell gate region A. The photoresist pattern is not formed on the selective transistor region B and the peri region C. This is because the second auxiliary layer 212 formed in the selective transistor region B and the peri region C is removed using the photoresist pattern since a micro pattern is not formed in the selective transistor region B and the peri region C.

Thereafter, the second auxiliary layer 212 formed in the selective transistor region B and the peri region C is etched using the photoresist pattern as an etch mask. In order to prevent the top surface of the silicon oxynitride (SiON) layer 204b, which is part of the hard mask layer 204, from being removed during the etch process, the second auxiliary layer 212 is removed by a dry etch process using the BARC layer 206 as an etch-stop layer. The photoresist pattern is then removed.

Figure 2E:
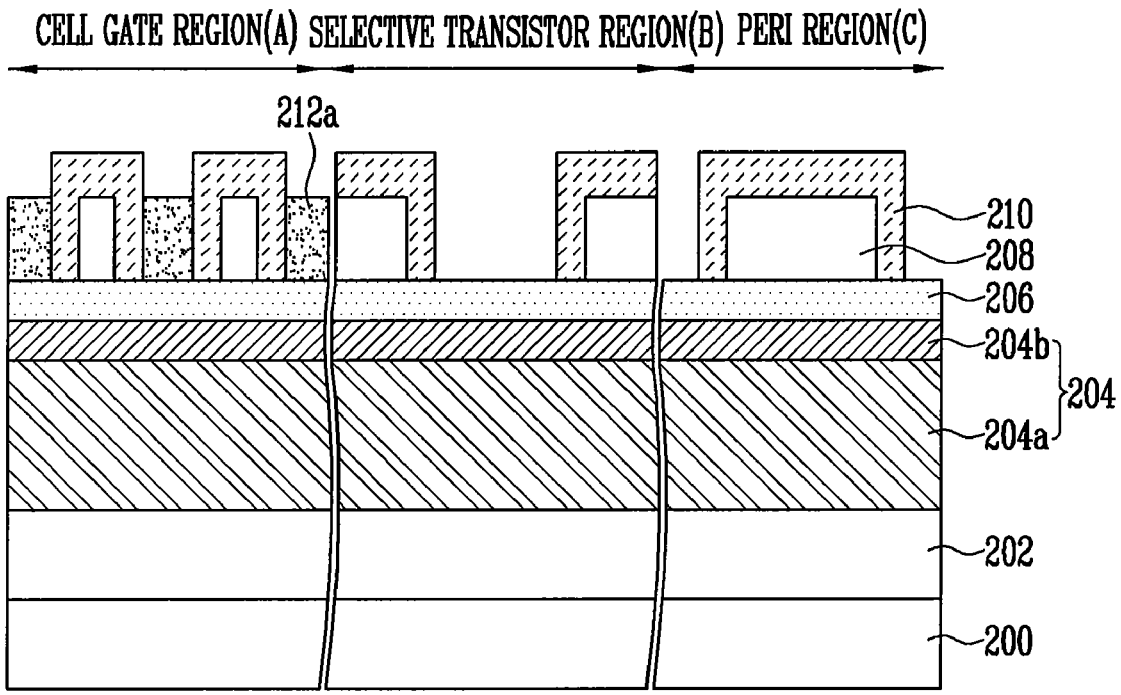

Referring to FIG. 2E, the second auxiliary layer 212 formed in the cell gate region A is etched by an etch process until the top surface of the insulating layer 210 is exposed, thereby forming a second auxiliary pattern 212a in the cell gate region A. The etch process may be performed using an etchback process. During the etch process of the second auxiliary layer 212 formed in the cell gate region A, the second auxiliary layer 212 formed between the insulating layers 210 is removed so that the second auxiliary layer 212 remains up to the height of the first auxiliary pattern 208. The second auxiliary layer 212 formed in the selective transistor region B is also removed until the top surface of the insulating layer 210 is exposed. The second auxiliary layer 212 has a different etch selectivity with respect to the insulating layer 210. Accordingly, the first auxiliary pattern 208 and the second auxiliary pattern 212a are formed of material having substantially the same etch selectivity.

Figure 2F:
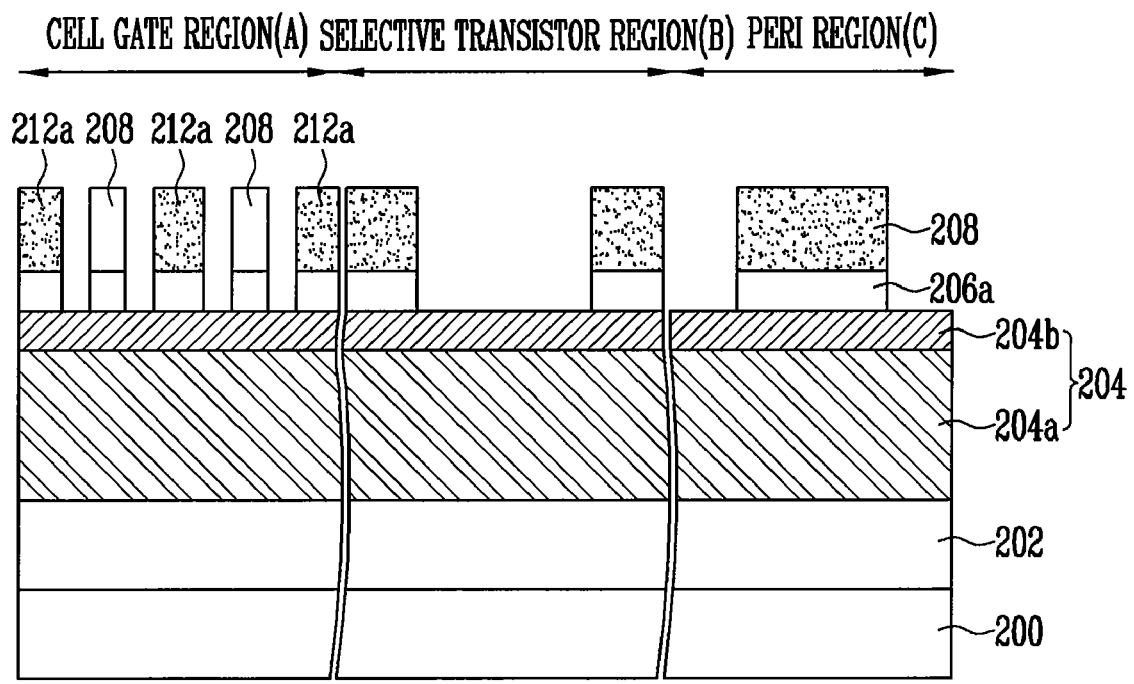

Referring to FIG. 2F, the insulating layer 210 formed between the insulating layer 210 exposed by the etch process of the second auxiliary layer 212, and the first auxiliary pattern 208 and the second auxiliary pattern 212a, and the BARC layer 206 formed below the insulating layer 210 are removed so that the BARC layer 206 remains only below the first auxiliary pattern 208 and the second auxiliary pattern 212a. A BARC pattern 206a is thereby formed. The insulating layer 210 is removed by a dry etch process. As described above with reference to FIG. 2B, if the insulating layer 210 is formed on the BARC layer 206 during the formation process of the insulating layer 210, the insulating layer 210 also remains below the second auxiliary pattern 212a during the removal process of the insulating layer 210.

Accordingly, during the removal process of the insulating layer 210, the insulating layer 210 has a different etch selectivity with respect to the first auxiliary pattern (208) material and the second auxiliary pattern (212a) material, and has substantially the same etch selectivity as that of the BARC layer 206. By forming the second auxiliary pattern 212a between the first auxiliary patterns 208 as described above, a desired pitch can be obtained. The insulating layer 210 formed in the cell gate region A, and the insulating layer 210 and the BARC layer 206 formed in the selective transistor region B and the peri region C during the removal process of the BARC layer 206 are also removed.

Figure 2G:
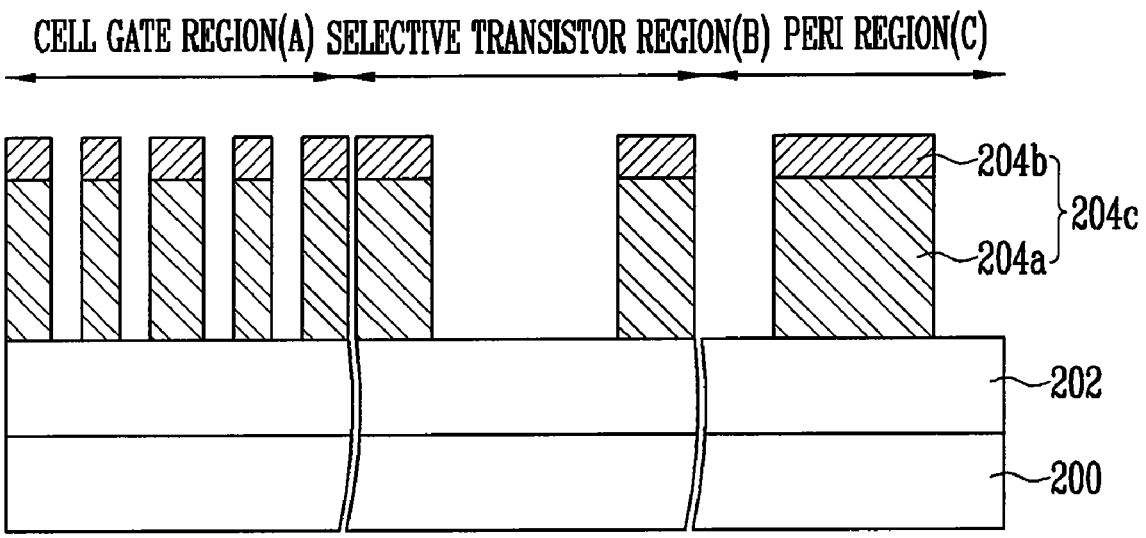

Referring to FIG. 2G, the hard mask pattern 204c having a desired line and space is formed by etching the hard mask layer 204 using the first auxiliary pattern 208, the BARC pattern 206a and the second auxiliary pattern 212a as etch masks. The hard mask layer 204 is removed by a dry etch process. As the first auxiliary pattern 208 and the second auxiliary pattern 212a are formed of material having substantially the same etch selectivity, the etch process can be facilitated during the etch process of the hard mask layer 204. Thus, the hard mask pattern 204c is uniform. In other words, the etch process of the hard mask layer 204 using the first auxiliary pattern 208 and the second auxiliary pattern 212a formed of material having substantially the same etch selectivity is more convenient than that of the hard mask layer 204 using the first auxiliary pattern 208 and the second auxiliary pattern 212a formed of materials having different etch selectivities.

Thereafter, the first auxiliary pattern 208, the BARC pattern 206a and the second auxiliary pattern 212a are removed to form a micro pattern including the hard mask pattern 204c.

Figure 2H:
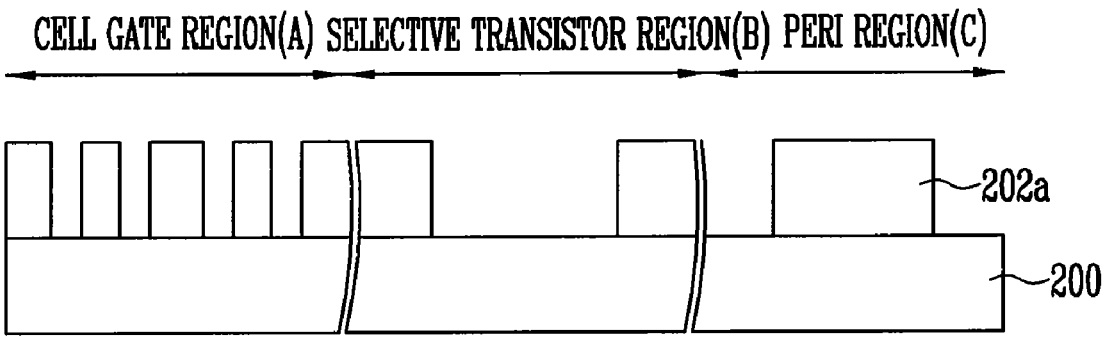

Referring to FIG. 2H, the etch target layer 202 is etched using the hard mask pattern 204c having a desired line and space as an etch mask, thereby forming a target etch pattern 202a. During the etch process of the etch target layer 202, the tunnel insulating layer, the first conductive layer for a floating gate, the dielectric layer and the second conductive layer for a control gate, formed between the etch target layer 202 and the semiconductor substrate 200, are also etched. Thus, a gate is formed. Thereafter, the hard mask pattern 204c is removed.

As described above, the micro pattern is formed only through the formation process of the first auxiliary pattern 208 and the second auxiliary pattern 212a. It is therefore possible to form a micro pattern having a desired CD. Furthermore, the number of process steps can be reduced since a DEET method or a spacer formation process, which has been used to form a micro pattern, are not performed. It is therefore possible to reduce device mass-production costs.

Furthermore, since the first auxiliary pattern 208 and the second auxiliary pattern 212a are formed of material having substantially the same etch selectivity, a uniform etch pattern can be formed during the etch process employing the first auxiliary pattern 208 and the second auxiliary pattern 212a. Accordingly, etching becomes more convenient compared to when the etch process is carried out using the first auxiliary pattern 208 and the second auxiliary pattern 212a formed of different materials.

As described above, the present invention may exhibit the following advantages.

First, a micro pattern is formed only through a formation process of a first auxiliary pattern and a second auxiliary pattern. It is therefore possible to form a micro pattern having a desired CD.

Second, since a DEET method or a spacer formation process, which was conventionally used to form a micro pattern, can be avoided, the number of process steps can be reduced.

Third, device mass-production costs may be reduced because the number of process steps is reduced.

Fourth, since a first auxiliary pattern and a second auxiliary pattern are formed of material having substantially the same etch selectivity, a uniform etch pattern can be formed during an etch process employing the first auxiliary pattern and the second auxiliary pattern. Accordingly, etching becomes more convenient compared to when the etch process is carried out using the first auxiliary pattern and the second auxiliary pattern formed of different materials.

Although the foregoing description has been made with reference to specific embodiments, it is to be understood that changes and modifications of the present invention may be made by one having ordinary skill in the art without departing from the spirit and scope of the present invention and appended claims.

What is claimed is:

1. A method of forming a micro pattern of a semiconductor device, the method comprising:
    forming an etch target layer, a hard mask layer, a Bottom Anti-Reflective Coating (BARC) layer and a first photoresist pattern containing silicon (Si) over a semiconductor substrate;
    forming an organic layer over a surface of the first photoresist pattern;
    forming a second photoresist layer containing silicon (Si) over the BARC layer and the organic layer;
    performing a first etch process so that the second photoresist layer remains on the BARC layer between the first photoresist patterns and becomes a second photoresist pattern;
    removing the organic layer on the first photoresist pattern and between the first and second photoresist patterns, and the BARC layer formed below the organic layer;
    etching the hard mask layer by a second etch process using the first and second photoresist patterns as an etch mask, thereby forming a hard mask pattern; and
    etching the etch target layer by a third etch process using the hard mask pattern as an etch mask.

2. The method of claim 1, wherein the etch target layer comprises a film of an insulating layer, a conductive layer or an interlayer insulating layer.

3. The method of claim 1, wherein the hard mask layer has a stack structure comprising an amorphous carbon layer and a silicon oxynitride (SiON) layer.

4. The method of claim 1, wherein the first photoresist pattern has a Critical Dimension (CD), which is approximately half of a pitch of a subsequently formed micro pattern.

5. The method of claim 1, wherein the organic layer is an amorphous carbon layer.

6. The method of claim 1, wherein the organic layer is formed over the BARC layer.

7. The method of claim 6, wherein the organic layer formed on the BARC layer remains on the first photoresist pattern and the second photoresist pattern during the removal process of the organic layer.

8. The method of claim 1, wherein the organic layer is formed of material having a different etch selectivity with respect to material of the second photoresist layer and the first photoresist pattern.

9. The method of claim 1, wherein the organic layer has substantially the same etch selectivity as the BARC layer.

10. The method of claim 1, wherein a thickness of the organic layer deposited on a side of the first photoresist pattern is approximately half of a pitch of a subsequently formed micro pattern.

11. The method of claim 1, wherein the second photoresist layer is etched by an etchback process.

12. The method of claim 1, wherein during the first etch process, the second photoresist pattern remains up to a height of the first photoresist pattern.

13. The method of claim 1, wherein the organic layer is removed by a dry etch process.

14. The method of claim 1, wherein the organic layer has a different etch selectivity with respect to the first photoresist pattern material and the second photoresist layer.

15. The method of claim 1, wherein the second photoresist pattern is formed between the first photoresist patterns.

16. The method of claim 1, wherein the second etch process comprises performing a dry etch process.

17. A method of forming a micro pattern of a semiconductor device, the method comprising:
    forming an etch target layer, a hard mask layer, a BARC layer and a first photoresist pattern containing silicon (Si) over a semiconductor substrate, wherein the semiconductor substrate comprises a cell gate region, a selective transistor region and a peri region;
    forming an organic layer over a surface of the first photoresist pattern;
    forming a second photoresist layer containing silicon (Si) over the BARC layer and the organic layer;
    removing the second photoresist layer formed in the selective transistor region and the peri region;
    performing a first etch process such that the second photoresist layer formed in the cell gate region remains on the BARC layer between the first photoresist patterns and becomes a second photoresist pattern;
    removing the organic layer on the first photoresist pattern and between the first and second photoresist patterns, and the BARC layer formed below the organic layer in the cell gate region;
    etching the hard mask layer by a second etch process using the first and second photoresist patterns as an etch mask, thereby forming a hard mask pattern; and
    etching the etch target layer by a third etch process using the hard mask pattern as an etch mask.

18. The method of claim 17, wherein the etch target layer is formed of a tungsten silicide (WSix) layer.

19. The method of claim 17, wherein a stack structure comprising a tunnel insulating layer, a first conductive layer for a floating gate, a dielectric layer and a second conductive layer for a control gate is formed between the etch target layer and the semiconductor substrate.

20. The method of claim 17, wherein the hard mask layer comprises a stack structure including an amorphous carbon layer and a silicon oxynitride (SiON) layer.

21. The method of claim 17, wherein the first photoresist pattern has a Critical Dimension (CD), which is approximately half of a pitch of a subsequently formed micro pattern.

22. The method of claim 17, wherein the organic layer is an amorphous carbon layer.

23. The method of claim 17, wherein the organic layer is formed over the BARC layer.

24. The method of claim 23, wherein the organic layer formed over the BARC layer remains on the first photoresist pattern and the second photoresist pattern during the removal process of the organic layer.

25. The method of claim 17, wherein the organic layer is formed of material having different etch selectivity with respect to material of the second photoresist layer and the first photoresist pattern.

26. The method of claim 17, wherein the organic layer has substantially the same etch selectivity as the BARC layer.

27. The method of claim 17, wherein a thickness of the organic layer deposited on a side of the first photoresist pattern is approximately half of a pitch of a subsequently formed micro pattern.

28. The method of claim 17, wherein the second photoresist layer formed in the selective transistor region and the peri region is removed by a dry etch process using the BARC layer as an etch-stop layer.

29. The method of claim 17, wherein during the etch process of the second photoresist layer formed in the cell gate region, the second photoresist layer in the selective transistor region is removed.

30. The method of claim 29, wherein the second photoresist layer in the selective transistor region is etched by an etchback process.

31. The method of claim 17, wherein during the first etch process, the second photoresist pattern remains up to a height of the first photoresist pattern.

32. The method of claim 17, wherein the organic layer has a different etch selectivity with respect to the first photoresist pattern material and the second photoresist layer.

33. The method of claim 17, wherein during the removal process of the organic layer and the BARC layer formed in the cell gate region, the organic layer and the BARC layer formed in the selective transistor region and the peri region are also removed.

34. The method of claim 17, wherein the organic layer and the BARC layer formed in the selective transistor region and the peri region are removed by a dry etch process.

35. The method of claim 17, wherein the second photoresist pattern is formed between the first photoresist patterns.

36. The method of claim 17, wherein the second etch process comprises performing a dry etch process.

37. The method of claim 19, wherein during the third etch process, the tunnel insulating layer, the first conductive layer for the floating gate, the dielectric layer and the second conductive layer for the control gate formed between the etch target layer and the semiconductor substrate are etched to form a gate.

38. A method of forming a micro pattern of a semiconductor device, the method comprising:
    forming an etch target layer, a hard mask layer, a BARC layer containing silicon and a first auxiliary pattern over a semiconductor substrate;
    forming an organic layer containing silicon over a surface of the first auxiliary pattern;
    forming a second auxiliary layer over the BARC layer and the organic layer;
    performing a first etch process such that the second auxiliary layer remains on the BARC layer between the first auxiliary patterns and becomes a second auxiliary pattern;
    removing the organic layer on the first auxiliary pattern and between the first and second auxiliary patterns, and the BARC layer formed below the organic layer;
    etching the hard mask layer by a second etch process using the first and second auxiliary patterns as etch masks, thereby forming a hard mask pattern; and
    etching the etch target layer by a third etch process using the hard mask pattern as an etch mask.

39. The method of claim 38, wherein the etch target layer comprises a film of an insulating layer, a conductive layer or an interlayer insulating layer.

40. The method of claim 38, wherein the hard mask layer comprises a stack structure including an amorphous carbon layer and a silicon oxynitride (SiON) layer.

41. The method of claim 38, wherein the first auxiliary layer is a photoresist layer.

42. The method of claim 38, wherein the first auxiliary pattern has a CD, which is approximately half of a pitch of a subsequently formed micro pattern.

43. The method of claim 38, wherein the organic layer is formed of material having a different etch selectivity with respect to the second auxiliary layer and the first auxiliary pattern material.

44. The method of claim 38, wherein the organic layer is formed over the BARC layer.

45. The method of claim 44, wherein the organic layer formed over the BARC layer remains below the first auxiliary pattern and the second auxiliary pattern during the removal process of the organic layer.

46. The method of claim 38, wherein the organic layer has substantially the same etch selectivity as the BARC layer.

47. The method of claim 38, wherein a thickness of the organic layer deposited on a side of the first auxiliary pattern is approximately half of a pitch of a subsequently formed micro pattern.

48. The method of claim 38, wherein the second auxiliary layer is a photoresist layer.

49. The method of claim 38, wherein the second auxiliary layer is etched by an etchback process.

50. The method of claim 38, wherein during the first etch process, the second auxiliary pattern remains up to a height of the first auxiliary pattern.

51. The method of claim 38, wherein the organic layer is removed by a dry etch process.

52. The method of claim 38, wherein the organic layer has a different etch selectivity with respect to material of the first auxiliary pattern and the second auxiliary pattern.

53. The method of claim 38, wherein the BARC layer and the organic layer have substantially the same etch selectivity.

54. The method of claim 38, wherein the second auxiliary pattern is formed between the first auxiliary patterns.

55. The method of claim 38, wherein the second etch process comprises performing a dry etch process.

56. A method of forming a micro pattern of a semiconductor device, the method comprising:
    forming an etch target layer, a hard mask layer, a BARC layer containing silicon and a first auxiliary pattern over a semiconductor substrate, wherein the semiconductor substrate comprises a cell gate region, a selective transistor region and a peri region;
    forming an organic layer containing silicon over a surface of the first auxiliary pattern;

forming a second auxiliary layer on the BARC layer and the organic layer;

removing the second auxiliary layer formed in the selective transistor region and the peri region;

performing a first etch process so that the second auxiliary layer formed in the cell gate region remains on the BARC layer between the first auxiliary patterns and becomes a second auxiliary pattern;

removing the organic layer on the first auxiliary pattern and between the first and second auxiliary patterns, and the BARC layer formed below the organic layer containing silicon in the cell gate region;

etching the hard mask layer by a second etch process using the first and second auxiliary patterns as etch masks, thereby forming a hard mask pattern; and etching the etch target layer by a third etch process using the hard mask pattern as an etch mask.

57. The method of claim 56, wherein the etch target layer is formed of a tungsten silicide (WSix) layer.

58. The method of claim 56, wherein a stack structure comprising a tunnel insulating layer, a first conductive layer for a floating gate, a dielectric layer and a second conductive layer for a control gate is formed between the etch target layer and the semiconductor substrate.

59. The method of claim 58, wherein during the third etch process, the tunnel insulating layer, the first conductive layer for the floating gate, the dielectric layer, and the second conductive layer for the control gate formed between the etch target layer and the semiconductor substrate are etched, thereby forming a gate.

60. The method of claim 56, wherein the hard mask layer comprises a stack structure including an amorphous carbon layer and a silicon oxynitride (SiON) layer.

61. The method of claim 56, wherein the first auxiliary layer is a photoresist layer.

62. The method of claim 56, wherein the first auxiliary pattern has a CD, which is approximately half of a pitch of a subsequently formed micro pattern.

63. The method of claim 56, wherein the organic layer is formed of material having a different etch selectivity with respect to the second auxiliary layer and the first auxiliary pattern material.

64. The method of claim 56, wherein the organic layer is formed over the BARC layer.

65. The method of claim 64, wherein the organic layer formed in the BARC layer remains below the first auxiliary pattern and the second auxiliary pattern during the removal process of the organic layer.

66. The method of claim 56, wherein the organic layer has substantially the same etch selectivity as the BARC layer.

67. The method of claim 56, wherein a thickness of the organic layer deposited on a side of the first auxiliary pattern is approximately half of a pitch of a subsequently formed micro pattern.

68. The method of claim 56, wherein the second auxiliary layer is a photoresist layer.

69. The method of claim 56, wherein during the removal process of the second auxiliary layer formed in the selective transistor region and the peri region, the second auxiliary layer is removed by a dry etch process using the BARC layer as an etch-stop layer.

70. The method of claim 56, wherein during the etch process of the second auxiliary layer formed in the cell gate region, the second auxiliary layer remaining in the selective transistor region is removed.

71. The method of claim 70, wherein the second auxiliary layer remaining in the selective transistor region is removed by an etchback process.

72. The method of claim 56, wherein during the first etch process, the second auxiliary pattern remains up to a height of the first auxiliary pattern.

73. The method of claim 56, wherein the organic layer has a different etch selectivity with respect to material of the first auxiliary pattern and the second auxiliary pattern.

74. The method of claim 56, wherein during the removal process of the organic layer and the BARC layer formed in the cell gate region, the organic layer formed in the selective transistor region and the peri region and the BARC layer are also removed.

75. The method of claim 56, wherein the BARC layer and the organic layer have substantially the same etch selectivity.

76. The method of claim 56, wherein the second auxiliary pattern is formed between the first auxiliary patterns.

77. The method of claim 56, wherein the second etch process comprises performing a dry etch process.

* * * * *